United States Patent [19]

Fukuda et al.

[11] Patent Number: 4,937,619
[45] Date of Patent: Jun. 26, 1990

[54] PROJECTION ALIGNER AND EXPOSURE METHOD

[75] Inventors: Hiroshi Fukuda, Kokubunji; Norio Hasegawa; Toshihiko Tanaka, both of Tokyo, all of Japan

[73] Assignee: Hitachi, Ltd., Tokyo, Japan

[21] Appl. No.: 307,513

[22] Filed: Feb. 8, 1989

Related U.S. Application Data

[63] Continuation-in-part of Ser. No. 83,211, Aug. 10, 1987, Pat. No. 4,869,999.

[30] Foreign Application Priority Data

May 6, 1988 [JP] Japan ............................. 63-108989

[51] Int. Cl.⁵ .......................................... G03B 27/42
[52] U.S. Cl. ....................................... 355/53; 355/46; 355/67
[58] Field of Search .................... 355/43, 46, 53, 67

[56] References Cited

U.S. PATENT DOCUMENTS

| | | | |
|---|---|---|---|
| 4,506,977 | 3/1985 | Sato et al. | 355/53 |
| 4,541,712 | 9/1985 | Whitney | 355/46 X |
| 4,619,508 | 10/1986 | Shibuya et al. | 335/67 X |
| 4,789,222 | 12/1988 | Ota et al. | 355/46 X |
| 4,811,055 | 3/1989 | Hirose | 355/53 |
| 4,812,880 | 3/1989 | Ogawa et al. | 355/53 |
| 4,819,033 | 4/1989 | Yoshitake et al. | 355/53 |
| 4,841,341 | 6/1989 | Ogawa et al. | 355/53 X |
| 4,851,882 | 7/1989 | Takahashi et al. | 355/46 |
| 4,851,978 | 7/1989 | Ichihara | 355/67 X |
| 4,853,756 | 9/1989 | Matsuki | 355/53 X |

OTHER PUBLICATIONS

"Semiconductor Lithography Technique", Koichiro Ho, Chapter 4, pp. 87–93.
Journal of Vacuum Science and Technology, B-1(4), 1983, pp. 1235–1240.

*Primary Examiner*—Richard A. Wintercorn
*Attorney, Agent, or Firm*—Antonelli, Terry, Stout & Kraus

[57] ABSTRACT

There are disclosed a projection aligner, and an exposure method, capable of largely increasing the effective focus latitude of a fine pattern by using light having a plurality of different wavelengths to perform projection exposure and by setting a plurality of focal planes on an identical optical axis by means of chromatic aberration of the projection lens. The present invention makes it possible to cope with insufficient depth of focus caused by a shortened wavelength of exposure light, an increased numerical aperture of the projection lens, increased uneven topography of the substrate surface incurred from the device structure formed in three dimensions, inclination of the substrate, and field curvature of the projection lens, for example.

20 Claims, 9 Drawing Sheets

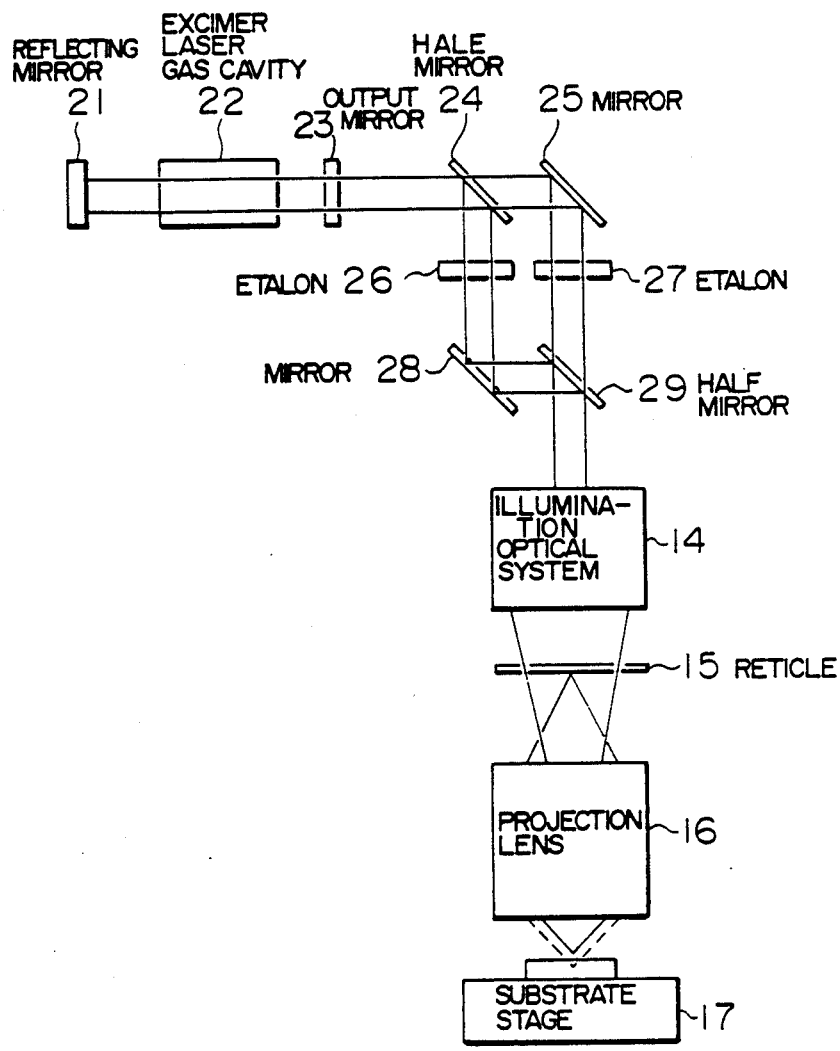

PROJECTION ALIGNER AND EXPOSURE METHOD

This application is a continuation-in-part of U.S. application Ser. No. 083,211, filed Aug. 10, 1987, now U.S. Pat. No. 4,869,999.

BACKGROUND OF THE INVENTION

The present invention relates to a projection aligner and an exposure method used for fine pattern formation of solid devices such as semiconductor devices, magnetic bubble devices and superconducting devices.

Heretofore, fine patterns such as wiring of solid devices including LSIs have been formed by using the projection exposure method, especially the reduction projection exposure method. In accordance with the above described method, an image of the mask pattern is focused and transferred onto a substrate with resist applied thereon by using a projection lens. Since the resolution limit in the reduction projection exposure method is in proportion to the exposure wavelength and is in inverse proportion to the numerical aperture of the protection lens, resolution improvement has been promoted by shortening the exposure wavelength and increasing the numerical aperture of the projection lens. On the other hand, the depth of focus of the projection lens is in proportion to the exposure length, and is in inverse proportion to the square of the numerical aperture of the projection lens. By attempting to improve the resolution, therefore, the depth of focus has been abruptly decreased. That is to say, it is difficult to make fine patterns compatible with insurance of sufficient depth of focus. Especially when high resolution is aimed at, the depth of focus becomes very shallow. Projection exposure methods are discussed in Chapter 4, pp. 87 to 93 of a book entitled "Semiconductor Lithography Technique", written by Koichiro Ho, and published by Sangyo Tosho, for example.

While circuit patterns are made finer with the advance of higher integration of LSIs, device functions arranged hitherto in two dimensions begin to be arranged in three dimensions. As a result, large topographies are caused on surfaces of LSIs. In addition, focal planes of mask patterns themselves are curved (field curvature), and substrates themselves are declined as a whole. Therefore, it is not possible to make the focal plane coincide with the substrate surface. In addition, the disagreement between the focal plane and the substrate surface is increased.

On the other hand, the depth of focus of projection lenses is being decreased with the improvement in resolution as described before. Therefore, it has become difficult to confine the above described device surface having a large topography over the entire face of the exposure field within the above described depth of focus and resolve fine patterns.

At the same time, one cannot help giving up the idea of making device dimension fine in order to ensure the depth of focus required for fabrication of an LSI.

In order to solve the above described problems, it is attempted to smooth the substrate surface by using the multilayer resist method or the like, reduce the field curvature and the substrate inclination, and improve the focus latitude from the viewpoint of process by using the CEL (Contrast Enhancement Lithography) method. However, the above described decrease in depth of focus of the projection lens is not sufficiently solved by these methods.

The multilayer resist method is described in Journal of Vacuum Science and Technology, B-1 (4), pp. 1235 to 1240 (1983), for example.

The present inventors paid their attention to the fact that the depth of focus of a lens can be made effectively deep by using the so-called focus latitude enhancement exposure (FLEX) method in which a plurality of images focused onto different positions on an identical optical axis are superposed each other. As a result, the present inventors thought out one technique for solving the above described problems. This technique was already applied for a patent (U.S. patent application Ser. No. 083,211, filed on Aug. 10, 1987). The above described our preceding patent application discloses that a photoresist layer is exposed under the condition that focal planes of a mask pattern (i.e., positions whereat accurately focused images of the mask pattern are formed) are set at a plurality of positions on the optical axis which are separated each other. As a more concrete technique of the above described exposure in which focal planes are set at a plurality of positions, it is disclosed in an embodiment that a stage carrying a substrate is moved in the direction of the optical axis for the fixed focal plane. When the stage is moved, however, high precision is demanded for the position control of the stage. Therefore, there is a fear that the resolution is lowered because the precision in stage position is limited.

SUMMARY OF THE INVENTION

An object of the present invention is to provide a novel, simple and convenient projection aligner, and exposure method in which resolution is not deteriorated because of a limit in precision of stage precision.

Another object of the present invention is to provide a projection aligner, and exposure method, coping with a decrease in focus latitude caused by an increase of topography of a substrate, inclination of the substrate, field curvature of a projection lens, an increased numerical aperture of the projection lens and a shortened wavelength of exposure light, i.e., a projection aligner, and exposure method capable of ensuring both a high resolution and a sufficient depth of focus even when an optical system having a short exposure wavelength and large numerical aperture is used.

Study of the present inventors revealed that the depth of focus of a projection lens could be effectively increased by using the so-called focus latitude enhancement exposure (FLEX) method in which a plurality of images focused onto different positions located on an identical optical axis are overlapped each other.

Therefore, the above described object is achieved by projecting a mask pattern onto a substrate by means of exposure light comprising a plurality of wavelengths so that the mask pattern is focused onto different positions in the optical path direction for every wavelength by means of chromatic aberration of the projection lens.

Further, the above described object is achieved by using a plurality of light beams narrowed in bandwidth around different wavelengths such as a plurality of excimer laser light beams narrowed in bandwidth simultaneously or alternately at least once for each beam in a projection aligner to perform exposure of one exposure region located on a substrate. The natural bandwidth of excimer laser light before bandwidth narrowing is approximately 0.5 nm. By the above described bandwidth narrowing, however, the bandwidth is confined to 5 pm or less, and preferably 3 pm or less.

Further, the above described object is achieved by equipping the above described projection aligner with a plurality of optical paths having bandwidth narrowing means for performing bandwidth narrowing around respective different wavelengths, and a light source such as a excimer laser light source or a illumination optical system having means for changing over one of the above described plurality of optical paths to the other.

Aiming at a higher resolution by using a shorter wavelength of exposure light, a projection exposure method using excimer laser light (KrF gas, wavelength of approximately 248 nm) instead of the g-line and i-line of a conventional high pressure mercury lamp has been developed. When this method is used, the so-called chromatic aberration correction in a projection lens becomes extremely difficult because of restriction of the lens material. Since the natural bandwidth of excimer laser light is comparatively wide as much as approximately 0.5 nm, sufficient image formation performance is not obtained if a projection lens which is not subject to chromatic aberration correction is used. Therefore, exposure is performed under the condition that the bandwidth of excimer laser light is narrowed.

FIG. 2 shows the wavelength spectrum of KrF excimer laser and an example of dependence upon the wavelength, of the position of the focal plane obtained when an image of mask pattern is formed by using the KrF excimer laser and a projection lens which is not subject to chromatic abberation correction.

As shown in FIG. 2, the position of the focal plane of the mask pattern largely changes because of chromatic aberration even within the range of the natural bandwidth of KrF excimer laser.

If the spectrum is narrowed in width around illustrated wavelengths $\lambda_1$ and $\lambda_2$, and two monochromatic light beams as represented by phantom outlines in FIG. 2 are used simultaneously or alternately to perform projection exposure, the mask pattern is focused onto two positions, which are located on an optical axis at an internal of $\Delta$, simultaneously or alternately.

In case of KrF excimer laser, $|\lambda_2-\lambda_1|$ can be so chosen as to be approximately 0.01 to 0.1 nm, for example. Accordingly, $\Delta$ can be defined to be approximately 1 to 10 $\mu$m.

If two images focused onto different positions on an identical optical axis are thus overlapped each other, the effective depth of focus can be increased by suitably choosing the above described distance $\Delta$ between the two focal planes. FIGS. 3A and 3B show examples of distribution of light intensity in the optical axis direction for a contact hole having a diameter of 0.3 $\mu$m under the condition that the KrF excimer laser and a projection lens having a numerical aperture of 0.4 are used. FIG. 3A shows the distribution of light intensity obtained by using a single focal plane in accordance with the prior art. If a range of +1 $\mu$m around the focal plane is exceeded, the intensity of light abruptly drops. On the other hand, FIG. 3B shows an example obtained by mutually shifting the light intensity distribution shown in FIG. 3A on an identical optical axis by 2.5 $\mu$m and superposing them. It is understood from FIGS. 3A and 3B that in the above described example the range on the optical axis providing favorable light intensity distribution can be widened to approximately three times as a result of the above described superposition.

BRIEF DESCRIPTION OF THE DRAWINGS

FIG. 4 is a configuration diagram showing a second embodiment of the present invention.

DESCRIPTION OF THE PREFERRED EMBODIMENTS

First Embodiment

An embodiment of the present invention will now be described by referring to drawings.

Figure 1:
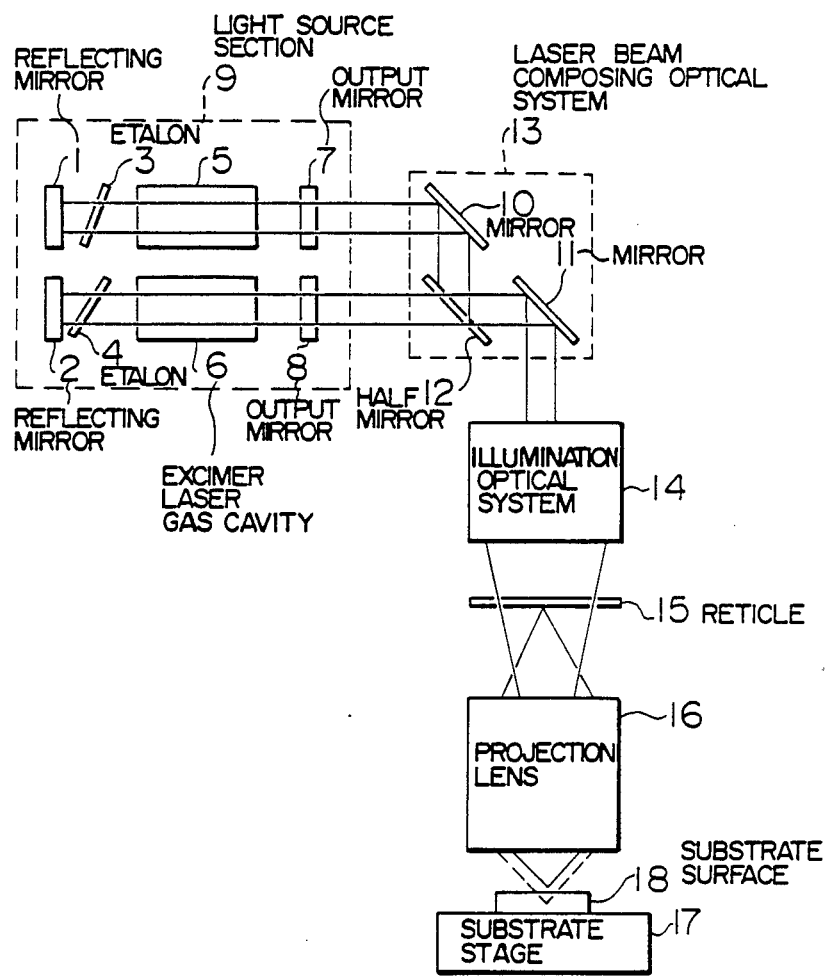
FIG. 1 is a configuration diagram showing a first embodiment of the present invention.
Figure 2:
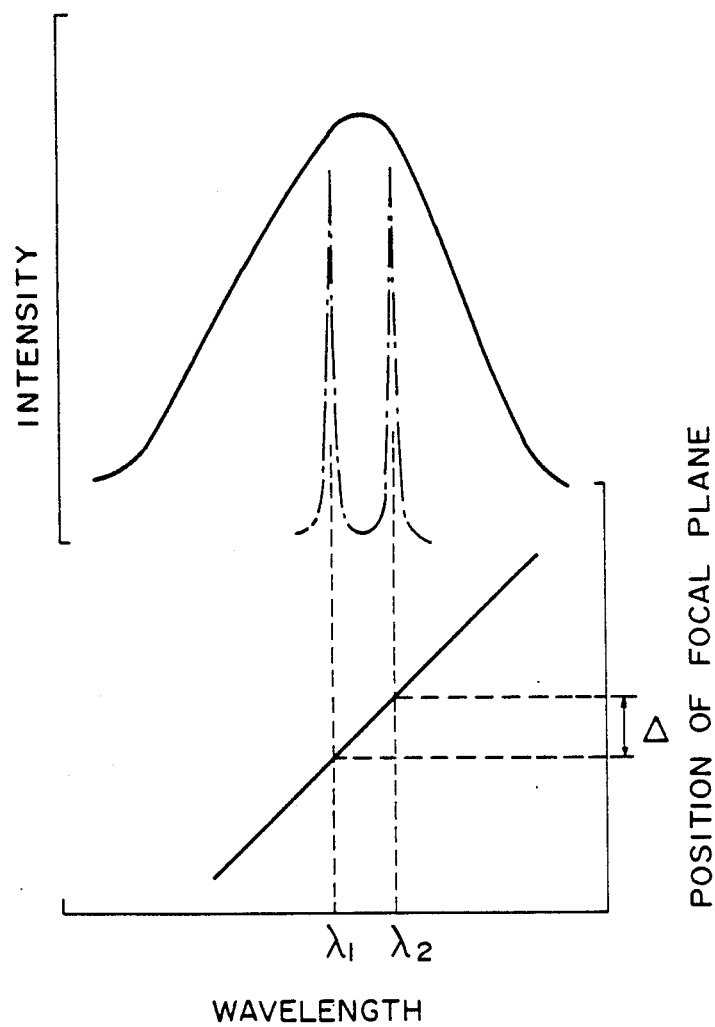
FIG. 2 is a characteristic diagram showing the principle of the present invention.
Figures 3A, 3B:
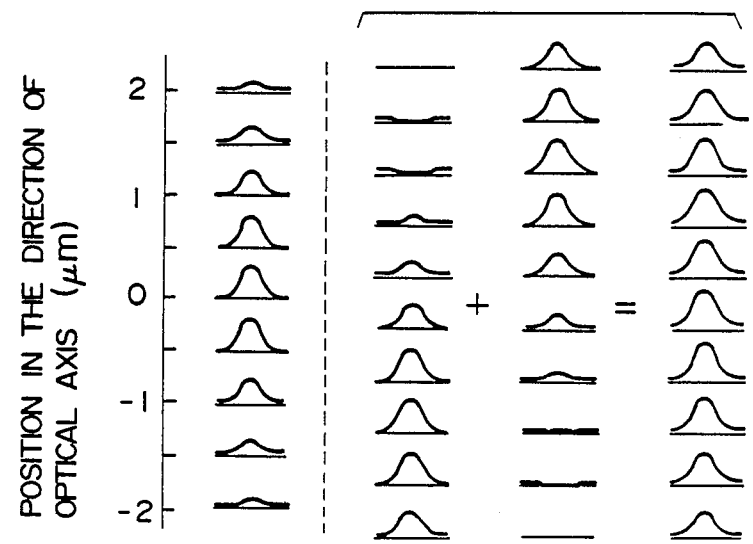
FIGS. 3A and 3B are characteristic diagrams showing the effect of the present invention.

FIG. 1 is a configuration diagram of an embodiment of a projection aligner according to the present invention. The present projection aligner comprises a light source section 9 having two reflecting mirrors 1 and 2, two etalons 3 and 4, two excimer laser gas cavities 5 and 6, and two output mirrors 7 and 8, a laser beam composing optical system 13 having mirrors 10 and 11, and a half mirror 12, an illumination optical system 14, a reticle 15, a projection lens 16, a substrate stage 17, and various elements required for the projection aligner.

The etalon 3 narrows the spectrum of laser light oscillated by the excimer laser resonator composed of a reflecting mirror 1, excimer laser gas cavity 5, and output mirror 7 around a wavelength $\lambda_1$. In the same way, the etalon 4 narrows the spectrum of laser light oscillated by the excimer laser resonator composed of a reflecting mirror 2, excimer laser gas cavity 6, and output mirror 8 around a wavelength $\lambda_2$. By changing the angle between the reflection plane and optical axis in each etalon 3 or 4, the above described $\lambda_1$ and $\lambda_2$ can be set respectively arbitrarily in the range of natural bandwidth of excimer laser of, say, 248.4±0.25 nm. Wavelength shift means such as a Raman cell may be disposed between the output mirror 7 and the mirror 10 or between the output mirror 8 and the mirror 12. It is thus also possible to set the two wavelengths $\lambda_1$ and $\lambda_2$ at values existing outside of the natural spectral range of excimer laser. Further, the means for bandwidth narrowing is not restricted to insertion of an etalon, but a combination of a prism and a reflecting mirror, reflection by grating, or the like may be used. Further, the injection-rocked laser may also be used. As a matter of course, it is possible to narrow the bandwidth and then shift the wavelength by using the Raman shift in these cases as well.

The above described laser beams respectively having wavelengths $\lambda_1$ and $\lambda_2$ are applied to the illumination optical system 14 via the laser beam composing optical system 13. In the illumination optical system, the laser beam is deflected on the secondary light source plane for every laser oscillation pulse, making the effective light source and its spatial coherency being reduced. Laser light emitted from the illumination optical system is focused near the entrance pupil of the projection lens 16 via the reticle 15. Since the above described laser light is composed light comprising monochromatic light beams respectively having wavelengths $\lambda_1$ and $\lambda_2$, however, those monochromatic light beams are not strictly focused onto the entrance pupil because of the chromatic aberration of the illumination optical system 14. By changing the range of the effective light source in the secondary light source plane in which the laser beam is deflected during exposure, the effective spatial coherency can be arbitrarily set in a possible range. In actual exposure, the effective coherence factor is preferably set at a value located between 0.5 and 0.8 in accordance with the pattern to be transferred. Further, the method of reducing the spatial coherency of a laser beam is not restricted to deflection of the laser beam adopted in the present embodiment, but various methods such as use of an incoherent optical device such as diffusing elements or optical path difference making means, and a combination of a fly-eye lens and deflection of a laser beam may be used.

Timing of laser pulse oscillation in each of the two excimer laser resonators is not especially restricted. However, it is desirable that the numbers of times of laser pulse oscillation in the two excimer laser resonators for one exposure region on the substrate are mutually equal.

A pattern on the reticle 15 is focused near the substrate surface 18 via the projection lens 16. The projection lens is a monochromatic lens made of fused silica and designed for central wavelengths of the above described two wavelengths $\lambda_1$ and $\lambda_2$. The projection lens has already undergone various aberration corrections with the exception of correction of chromatic aberration caused at the point of focal plane. Therefore, positions of focal planes for the pattern on the reticle obtained by using the above described beams having two wavelengths are not coincident each other. Therefore, the above described focus latitude enhancement exposure can be performed by using the present projection aligner. The projection lens may comprise a focal point achromatic objective lens disposed at the mask side and a focal length achromatic lens disposed at the substrate side. It is now supposed that the above described achromatization is performed for the above described two wavelengths $\lambda_1$ and $\lambda_2$. As a result, it is possible to make the focusing magnification values of the focused image to the pattern on the reticle 15 obtained by using the above described two wavelengths accurately equal each other. The composition material of the projection lens is not limited to fused silica used in the present embodiment, but any material may be used so long as it has a sufficient transmission with respect to the above described two wavelengths $\lambda_1$ and $\lambda_2$. Or a plurality of materials may be combined.

By using the above described projection aligner, a pattern on the reticle 15 was projected onto a substrate with resist applied thereon to perform exposure and then development was performed. A fine resist pattern was thus formed actually. Further, at this time the height of the substrate stage was set at various values to investigate the range of the stage height in which the pattern was resolved, i.e., the depth of focus for that pattern.

As the excitation gas of excimer laser, KrF was used. Before the bandwidth is narrowed by an etalon, the central wavelength is approximately 248.4 nm and the FWHM (full width of half maximum) is approximately 0.5 nm. Angles of the etalons 3 and 4 were adjusted to make $\lambda_1$ and $\lambda_2$ equal to 248.39 nm and 248.41 nm, respectively. The FWHM of each spectrum narrowed in bandwidth is approximately 0.003 nm (=3 pm). The numerical aperture of the projection lens 16 was 0.4. The discrepancy between positions of focal planes of the pattern on the reticle caused by chromatic aberration for the above described two wavelengths was approximately 2 $\mu$m.

A contact hole having a diameter of 0.3 $\mu$m could be resolved by the present projection aligner, and its depth of focus was approximately $+1.5$ $\mu$m. Further, a stripe pattern of 0.35 $\mu$m could be resolved by the present projection aligner, and its depth of focus was close to $+1.5$ $\mu$m. For the purpose of comparison, a similar experiment was performed under the condition that the positions of focal planes obtained for two beams were made coincident each other by making angles of the two etalons equal each other and making both $\lambda_1$ and $\lambda_2$ equivalent to 248.4 nm. As a result, the contact hole having the diameter of 0.3 $\mu$m and the stripe pattern of 0.35 $\mu$m could be resolved in this case as well. However, its depth of focus was $+0.5$ $\mu$m and $+1$ $\mu$m, respectively. As heretofore described, an increase of depth of focus owing to the effect of the focus latitude enhancement exposure of the present projection aligner was appreciated.

Since the projection lens of the present projection aligner had field curvature of approximately 0.6 $\mu$m, it was not until the use of exposure using the above described two different wavelengths that the above described pattern could be resolved on a substrate having an effective topography of approximately 0.4 $\mu$m caused by the inclination of the substrate and a device topography of approximately 1 $\mu$m.

Since the projection lens used in the present embodiment was one to be used for monochromatic light, a change of magnification, image distortion and the like caused by performing exposure with a wavelength other than a predetermined wavelength set at the time of lens design were somewhat appreciated. Originally, however, it is a matter of course that it is desirable to perform the lens design so that the focal plane may be shifted in the optical axis direction while keeping changes in magnification, image distortion, field curvature, and the like within a constant permissible range by applying chromatic aberration corrections to various aberrations such as the magnification factor, image distortion, and field curvature when changing the wavelength.

Since in the present embodiment the device for line narrowing is disposed between the output mirror and the reflecting mirror of the excimer laser resonator, it is possible to limit the lowering of the laser output caused by the bandwidth narrowing to a small value and perform the bandwidth narrowing efficiently. In addition, since laser light generated by a plurality of laser resonators is used, it is possible to obtain large exposure energy and complete exposure in an extremely short time.

Second Embodiment

FIG. 4 is a configuration diagram of a second embodiment of the present invention. The embodiment shown in FIG. 4 comprises a reflecting mirror 21, an excimer laser gas cavity 22, an output mirror 23, half mirrors 24 and 29, mirrors 25 and 28, etalons 26 and 27, an illumination optical system 14, a reticle 15, a projection lens 16, a substrate stage 17, and various elements required for the projection aligner.

A laser beam emitted from the excimer laser resonator composed of a reflecting mirror 21, excimer laser gas cavity 22, and output mirror 23 is separated into two optical paths by the half mirror 24. Two laser beams thus separated are narrowed in bandwidth respectively around wavelengths $\lambda_1$ and $\lambda_2$, which are different each other, by the etalons 26 and 27. The two laser beams thus narrowed in bandwidth are composed by the half mirror 29, and then the reticle 15 is illuminated by the resultant laser beam via the illumination optical system 14. Since the pattern on the reticle 15 is focused onto different positions on an identical optical axis with respect to the above described two wavelengths by the projection lens 16, focus latitude enhancement exposure can be performed by using the present projection aligner. In addition to the above described configuration, bandwidth narrowing devices such as etalons and gratings may be inserted between the reflecting mirror 21 and the excimer laser gas cavity 22, or between the excimer laser gas cavity 22 and the output mirror 23. In this case, the above described bandwidth narrowing devices convert the oscillation bandwidth of excimer laser into a plurality of spectra narrowed in bandwidth around different wavelengths, and each of the etalons 26 and 27 selects only one line of spectrum having a different wavelength out of them and transmits it.

In the present embodiment, is possible to perform the focus latitude enhancement exposure using color aberration without using a plurality of excimer laser resonators. Therefore, the present embodiment has advantages that the size of the entire projection aligner is comparatively small, and the projection aligner is favorably economical.

By using the present projection aligner, it was confirmed that the depth of focus of fine patterns increased in the same way as the first embodiment.

Third Embodiment

Figure 5:
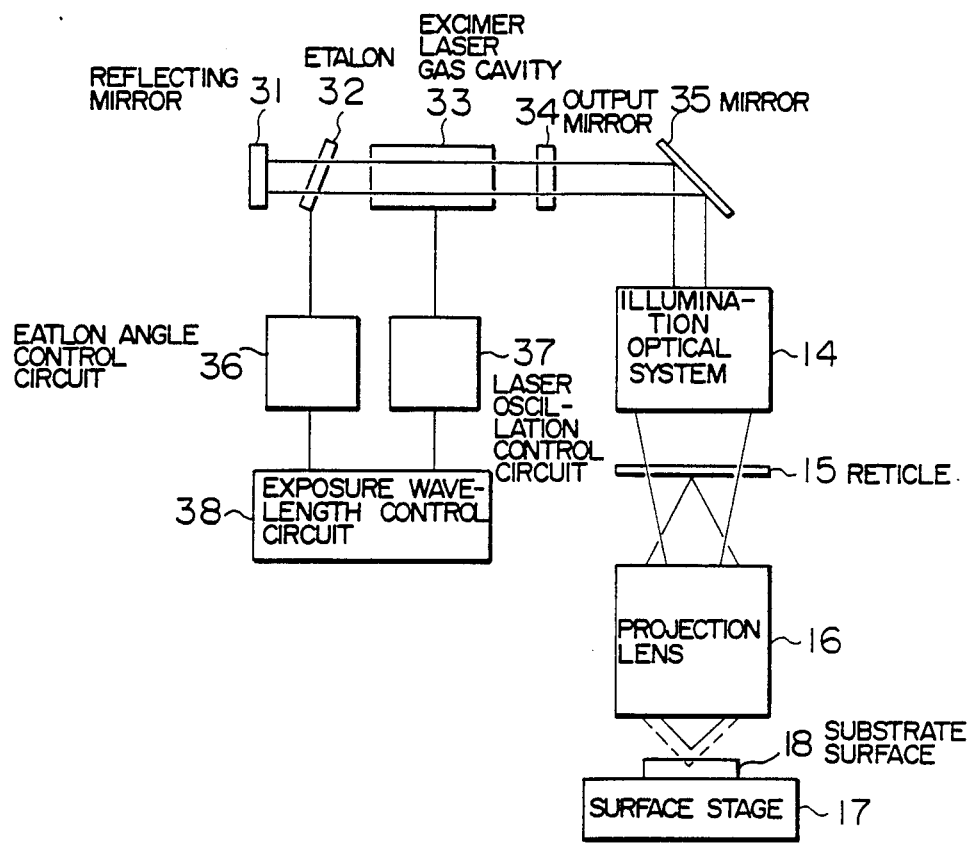
FIG. 5 is a configuration diagram showing a third embodiment of the present invention.

FIG. 5 is a configuration diagram of a third embodiment of the present invention. The embodiment shown in FIG. 5 comprises a reflecting mirror 31, an etalon 32, an excimer laser gas cavity 33, an output mirror 34, a mirror 35, an etalon angle control circuit 36, a laser oscillation control circuit 37, an exposure wavelength control circuit 38, an illumination optical system 14, a reticle 15, a projection lens 16, a substrate stage 17, and various elements required for the projection aligner.

The etalon 32 narrows the bandwidth of the laser beam oscillated by the excimer laser resonator composed of a reflecting mirror 31, excimer laser gas cavity 33, and an output mirror 34, and changes the central wavelength of light narrowed in bandwidth by adjusting the angle of the etalon 32 minutely. The wavelength control circuit 38 sends a command to the etalon angle control circuit 36 to set the angle of the etalon at a predetermined value, and sends a command to the laser oscillation control circuit 37 to cause laser oscillation with a predetermined number of exposure pulses for the etalon angle. The exposure wavelength control circuit 38 is capable of changing the set angle of the etalon 32 during the exposure of one exposure region located on the substrate by using the above described function and is capable of performing projection exposure by using light having a plurality of different wavelengths. Since the projection lens 16 focuses the pattern on the reticle 15 onto a different position on an identical optical axis with respect to each of the above described plurality of wavelengths, it is possible to perform the focus latitude enhancement exposure by using the present projection aligner.

Instead of being disposed between the reflecting mirror 31 and the laser resonator 33 as shown in FIG. 5, the etalon 32 and the wavelength control means may be disposed between the output mirror 34 and the laser gas cavity 33, or between the output mirror 34 and the illumination optical system 14, for example. Further, the above described line narrowing and wavelength alteration are not restricted to the method of changing the angle of the etalon.

The present embodiment is economically advantageous because only one excimer laser is used. In addition, lowering of laser output caused by bandwidth narrowing can be limited to a small value because the bandwidth narrowing device is disposed between the reflecting mirror and the output mirror.

By using the present projection aligner, it was confirmed that the depth of focus of fine patterns increased in the same way as the first embodiment.

Fourth Embodiment

Figure 6:
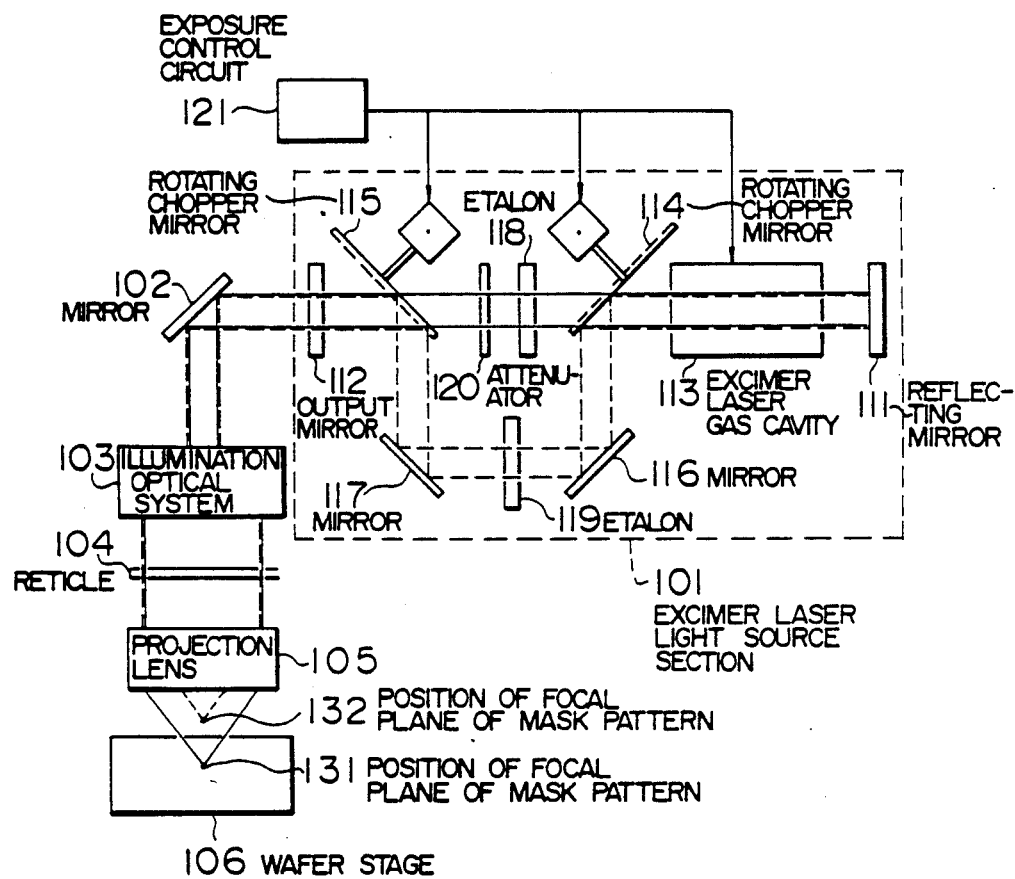
FIG. 6 is a configuration diagram showing a fourth embodiment of the present invention.

A fourth embodiment of the present invention will now be described by referring to FIG. 6. FIG. 6 is a configuration diagram of an embodiment of a reduction projection aligner. The compressing projection aligner comprises an excimer laser light source section 101, a mirror 102, an illumination optical system 103, a reticle 104, a projection lens 105, a substrate stage 106, and various elements required for the reduction projection aligner. The excimer laser light source section 101 comprises a reflecting mirror 111 and an output mirror 112. Between the reflecting mirror 111 and the output mirror 112, the excimer laser light source section 101 comprises a laser gas cavity 113, two rotating chopper mirrors 114 and 115, two mirrors 116 and 117, two etalons 118 and 119, and an attenuator 120. These elements are disposed respectively as shown in FIG. 6.

By rotating the rotating chopper mirror, the mirror face of the chopper mirror is periodically inserted into a laser beam path for a predetermined time.

Figure 7A:
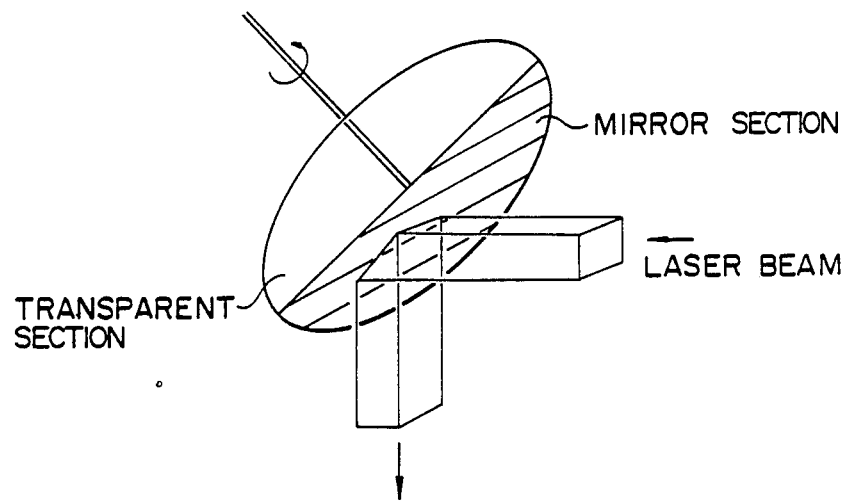
FIGS. 7A and 7B are concept diagrams of a rotating chopper mirror.
Figure 7B:
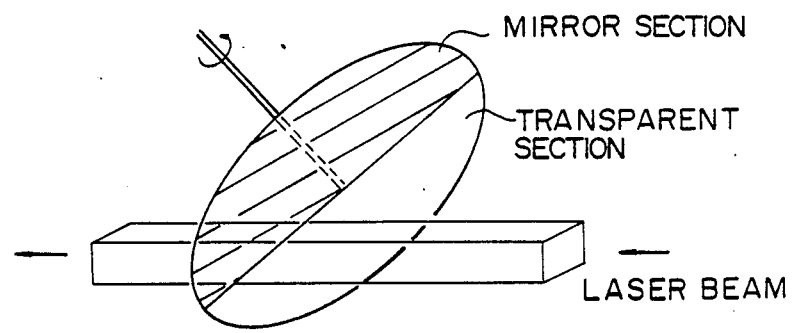

FIGS. 7A and 7B are concept diagrams of the rotating chopper mirror. FIG. 7A shows a case where the mirror section of a rotating chopper mirror is inserted into an optical path, and the laser beam is deflected by the mirror section. FIG. 7B shows a case where the mirror section of the rotating chopper mirror is off the optical path and the laser beam goes straight ahead.

Rotation periods and phases of the two rotating chopper mirrors 114 and 115 are so set as to be equal each other. That is to say, the timing of insertion of the mirror section of one of the two rotating chopper mirrors 14 and 15 into the optical path of the laser beam and the duration of its insertion are equivalent to those of the mirror section of the other of the two rotating chopper mirrors 14 and 15.

When the mirror section of the rotating chopper mirror is present on the optical path of laser beam, laser light goes and returns between the output mirror 112 and the reflecting mirror 111 through an optical path comprising the mirror sections of the two rotating chopper mirrors, the mirrors 116 and 117, and the etalon 119, resulting in oscillation. On the other hand, when the mirror section is not present on the optical path, laser light goes and returns through an optical path comprising the etalon 118 and the attenuator 120 and hence is oscillated.

The etalons 118 and 119 narrow the bandwidth of the oscillated laser light around two different wavelengths (hereafter referred to respectively as $\lambda_1$ and $\lambda_2$), respectively. By rotating the rotating chopper mirrors, therefore, the light narrowed in bandwidth by the etalon 118 (having the wavelength $\lambda_1$) and the light narrowed in bandwidth by the etalon 119 (having the wavelength $\lambda_2$) are alternately outputted from the output mirror. These etalons can be interchanged, adjusted in angle, or adjusted in gap. As a result, absolute values of the above described two wavelengths can be adjusted. Further, each of the etalons 118 and 119 is not restricted to a single sheet. Instead, a plurality of etalons may be overlapped and used.

The image of the reticle 104 is illuminated by the light (wavelengths $\lambda_1$ and $\lambda_2$) narrowed in bandwidth by the etalons 118 and 119, and focused onto positions of focal planes 131 and 132 respectively by the projection lens 105. Since the projection lens 105 has not been subject to chromatic aberration correction with respect to the position of focal plane, the positions of focal planes 131 and 132 obtained by beams of different wavelengths do not agree to each other.

Exposure for one exposure region on the substrate is performed by using a plurality of laser pulses. By rotating the rotating chopper mirrors during the above described exposure, pulsive light narrowed in bandwidth around the wavelength $\lambda_1$ and pulsive light narrowed in bandwidth around the wavelength $\lambda_2$ alternately appear in the exposure light. Therefore, the above described exposure is performed by overlapping the projection image of the mask pattern focused onto the position of focal plane 131 with the projection image focused onto the position of focal plane 132. That is to say, the above described focus latitude enhancement exposure method is thus realized.

It is possible to synchronize the rotation of the rotating choppers mirror with the timing of laser pulse oscillation. That is to say, the number of laser pulses oscillated in an interval during which the mirror section of the rotating chopper mirrors are inserted into the optical path and the number of laser pulses oscillated in an interval during which the mirror section of the rotating chopper mirrors are not inserted into the optical path can be adjusted independently. These timing adjustments are performed by the exposure control circuit 121. The exposure control circuit 121 may also be omitted. Further, the ratio between the numbers of pulses respectively oscillated during the above described intervals can also be adjusted by changing the ratio of the area of the mirror section of the rotating chopper mirror to the area of the non-mirror section or the transparent section thereof. In general, the period of rotation of the chopper mirror and the period of laser pulse oscillation are so adjusted that at least one laser pulse may be oscillated in each of the above described intervals.

In the focus latitude enhancement exposure method, it is desirable that intensities of images focused onto two positions of focal planes are equivalent each other. The light intensity of laser light narrowed in bandwidth by the etalon 119 is lowered by the reflection at the mirror sections of the rotating chopper mirrors 114 and 115 as well as the mirrors 116 and 117. The attenuator 120 is so inserted that the output energy per pulse of laser pulse narrowed in bandwidth by the etalon 118 may become equal to the output energy per pulse of laser pulse narrowed in bandwidth by the etalon 119. By making the numbers of laser pulses passing through the two etalons equal each other, therefore, it is possible to make intensities of images focused onto two positions of focal planes equal each other. Instead of inserting the attenuator 120, however, the above described lowering of output energy per pulse may be canceled by increasing the proportion of the number of pulses narrowed in bandwidth by the etalon 119.

In the present embodiment, rotating chopper mirrors are used as optical path changing means, and the etalons are used as bandwidth narrowing means. However, other devices having similar functions can be used. Further, the present embodiment can be so expanded as to allow exposure using two or more wavelengths by increasing the number of optical paths.

In the present embodiment, advantages similar to those of the third embodiment can be obtained without using precision operating mechanism such as angle adjustment of the etalon.

In the same way as the first embodiment, fine patterns were formed on the resist by using the present projection aligner, and a similar effect was obtained.

Fifth Embodiment

Figure 8:
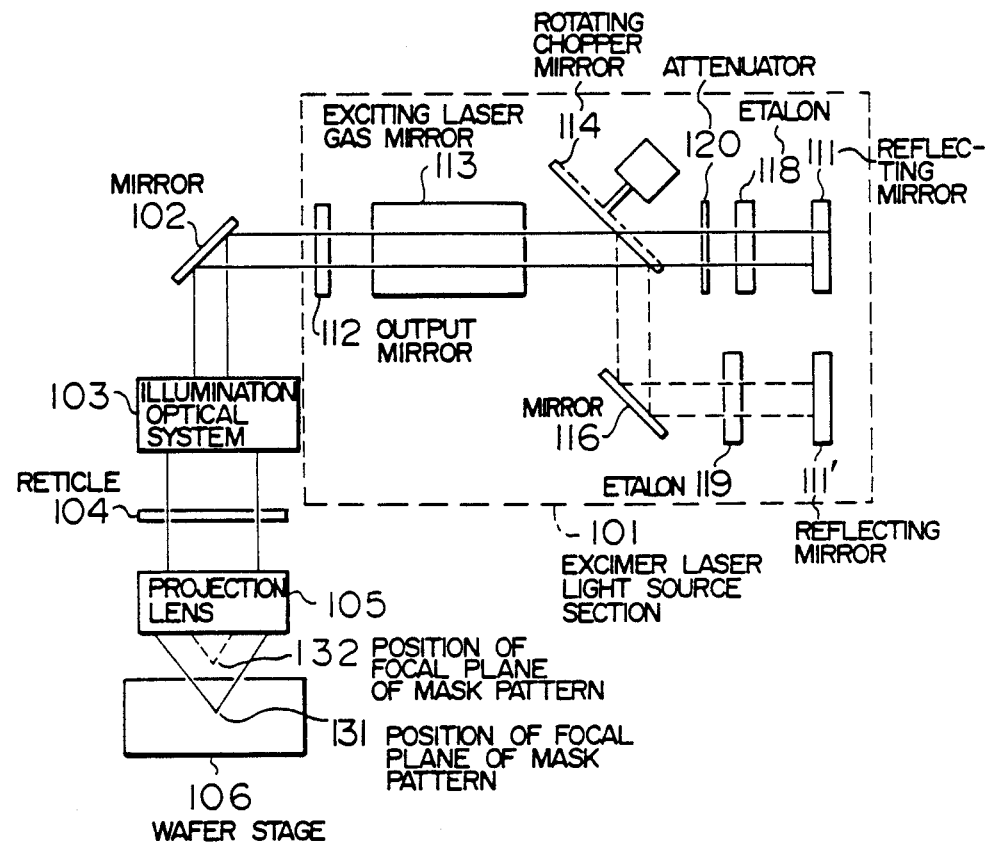
FIG. 8 is a configuration diagram showing a fifth embodiment of the present invention.

A fifth embodiment of the present invention will now be described by referring to FIG. 8. FIG. 8 is an example of a configuration diagram of the present embodiment of a reduction projection aligner.

In the projection aligner of the fourth embodiment, the two optical paths are disposed between the output mirror and the laser gas cavity. In the projection aligner of the present embodiment, two optical paths are disposed between the laser gas cavity and the reflecting mirrors as shown in FIG. 8. One reflecting mirror is disposed for each of the two optical paths.

In the present embodiment, prisms or gratings or their combination may be used as bandwidth narrowing devices instead of the etalons. In the present embodiment as well, it is possible to obtain laser beams of high output narrowed in bandwidth around two different wavelengths from one excimer laser and perform exposure by using those laser beams without using precision operating mechanism in the same way as the fourth embodiment.

By using the present projection aligner, fine patterns were formed on the resist in the same way as the first embodiment, and a similar effect was obtained.

Sixth Embodiment

Figure 9:
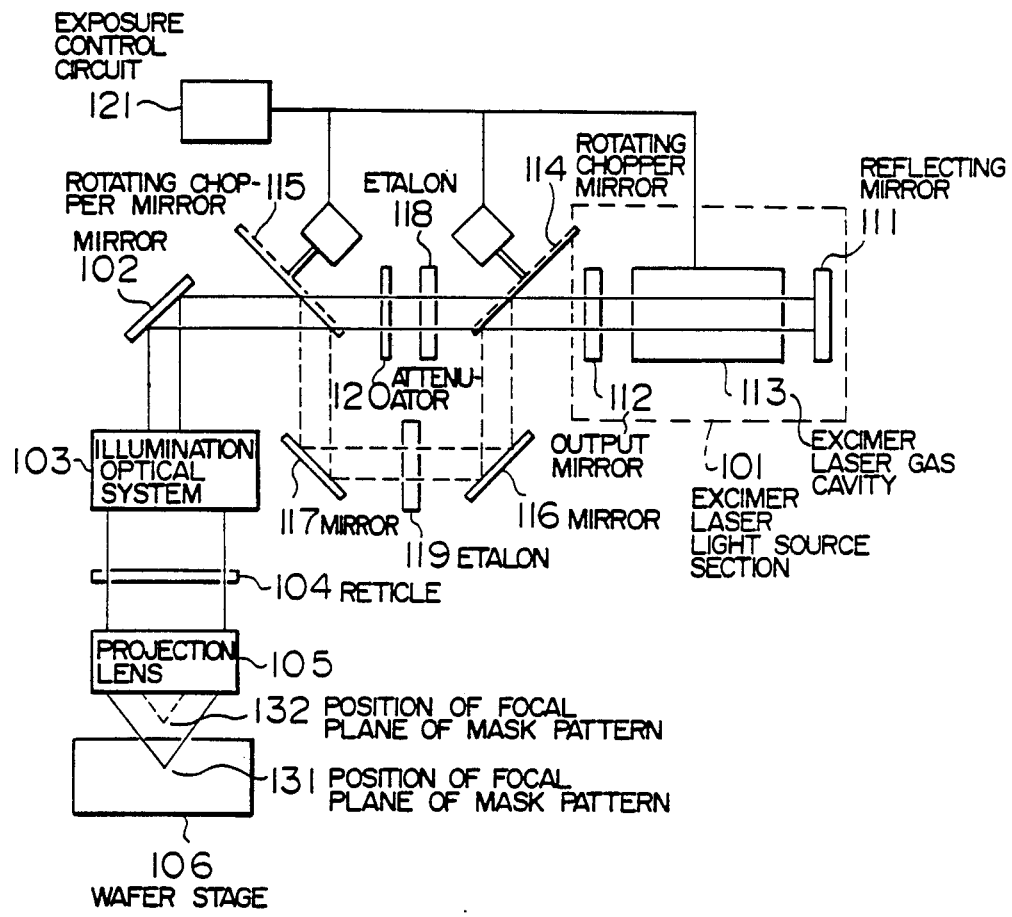
FIG. 9 is a configuration diagram showing a sixth embodiment of the present invention.

A sixth embodiment of the present invention will now be described by referring to FIG. 9. FIG. 9 is an example of a configuration diagram of the present embodiment of a reduction projection aligner.

In the projection aligner of the present embodiment, two optical paths are disposed between the output mirror and the illumination optical system.

By using the present projection aligner, fine patterns were formed in the same way as the first embodiment, and a similar effect was obtained.

In the present embodiment, chopper mirrors 114 and 115 are disposed outside the light source section 101. Therefore, the light source is not restricted to a coherent light source such as excimer laser. Instead, an incoherent light source such as a high pressure mercury lamp, a xenon lamp, or a microwave excitation lamp may be used. In this case, the bandwidth narrowing means is not restricted to the etalon, but various wavelength filters may be used.

In a projection aligner according to the present invention described wherein the mask pattern is projected onto a substrate to perform exposure, projection exposure is performed by using the light comprising a plurality of different wavelengths, and a plurality of focal planes are set on an optical axis by using the chromatic aberration of the projection lens. As a result, the effective focus latitude of fine patterns can be increased by at least approximately 70% to 200%. It is thus possible to cope with insufficient depth of focus caused by a shortened wavelength of exposure light, an increased numerical aperture of a projection lens, increased uneven topography on the surface of a substrate resulting from the device structure formed in three dimensions, inclination of the substrate, and field curvature of the projection lens, for example.

By using a projection aligner according to the present invention, therefore, it is possible to remove significant hindrance caused when the projection exposure method is applied to fine pattern forming in solid state devices such as LSIs. As a result, the application range of the projection exposure method can be expanded to fabrication of finer solid state devices.

We claim:

1. A projection aligner for projecting a mask pattern onto a substrate to perform exposure, comprising:
    means for emitting a plurality of light beams having different wavelengths; and
    projection exposure means for focusing said mask pattern on different positions in the optical axis direction with respect to each of said plurality of light beams having different wavelengths.

2. A projection aligner according to claim 1, wherein said projection aligner comprises a reduction projection aligner for projecting the mask pattern compressed in size onto the substrate to perform exposure.

3. A projection aligner according to claim 1, wherein said light beams used for projection exposure comprise excimer laser beams.

4. A projection aligner according to claim 1, wherein said projection exposure means comprises a projection lens which is transparent with respect to said light beams used for exposure, and which includes a plurality of kinds of materials or a single kind of material.

5. A projection aligner according to claim 1, wherein said projection exposure means comprises such a projection lens that a focal plane of the mask pattern can be moved in the optical axis direction while keeping the magnification of the focused image to said mask pattern, the field curvature of the focal plane of said mask pattern, and the image distortion within a predetermined permissible range by changing the wavelength within a range of said plurality of different wavelengths used for projection exposure.

6. A projection aligner according to claim 1, wherein said means for emitting a plurality of light beams having different wavelengths comprises a light source having a wavelength spectrum including a plurality of bright lines differing in central wavelength.

7. A projection aligner according to claim 1, wherein said means for emitting a plurality of light beams having different wavelengths comprises a plurality of light sources for emitting light beams narrowed in bandwidth around wavelengths which are different each other.

8. A projection aligner according to claim 1, wherein said means for emitting a plurality of light beams having different wavelengths comprises a combination of a light source for emitting a light beam having a predetermined bandwidth, and means for narrowing the bandwidth of the light beam emitted from said light source around a plurality of different wavelengths.

9. A projection aligner according to claim 1, wherein said means for emitting a plurality of light beams having different wavelengths comprises a combination of:
    a light source for emitting a light beam having a predetermined central wavelength or a light beam narrowed in wavelength around said central wavelength; and
    wavelength shifting means for changing the central wavelength of the light beam emitted by said light source.

10. A projection aligner according to claim 1, wherein said means for emitting a plurality of light beam having different wavelengths comprises a combination of:
    said wavelength shifting means; and
    exposure wavelength control means for changing the exposure wavelength during exposure for one exposure region located on said substrate.

11. A projection aligner for projecting a mask pattern onto a substrate to perform exposure by using light, comprising:
    a light source;
    bandwidth narrowing means for narrowing bandwidths of light beams emitted from said light source around different wavelengths; and
    means for changing over optical paths of a plurality of said light beams.

12. A projection aligner according to claim 11, wherein said projection aligner comprises a reduction projection aligner for projecting the mask pattern compressed in size onto the substrate to perform exposure 13. A projection aligner according to claim 11, wherein said light source comprises excimer laser.

14. A projection aligner according to claim 11, wherein said plurality of optical path changing-over means comprises a rotating chopper mirror.

15. A projection aligner according to claim 11, wherein said bandwidth narrowing means comprises etalons, gratings, prisms, or their combination.

16. An exposure method for projecting a mask pattern onto a substrate to perform exposure, comprising the steps of:
    narrowing the bandwidths of light beams emitted from a light source around different wavelengths; and
    performing exposure while changing over optical paths of said plurality of light beams narrowed in bandwidth at high speed.

17. An exposure method according to claim 16, wherein said mask pattern is projected onto the substrate to perform exposure while said mask pattern is being compressed in size.

18. An exposure method according to claim 16, wherein a changeover period of said plurality of optical paths is made shorter than exposure time of one exposure region located on the substrate.

19. An exposure method for projecting a mask pattern onto a substrate to perform exposure, wherein exposure of an identical position on the substrate is performed by focusing the mask pattern onto different positions in the optical axis direction by using a plurality of light beams having different wavelengths.

20. An exposure method according to claim 19, wherein said mask pattern is projected onto the substrate to perform exposure while said mask pattern is being compressed in size.

* * * * *